United States Patent
Seki et al.

(10) Patent No.: US 11,177,300 B2
(45) Date of Patent: Nov. 16, 2021

(54) SOLID-STATE IMAGE PICKUP APPARATUS, METHOD OF MANUFACTURING SOLID-STATE IMAGE PICKUP APPARATUS, AND ELECTRONIC APPARATUS

(71) Applicant: SONY CORPORATION, Tokyo (JP)

(72) Inventors: Hirokazu Seki, Oita (JP); Go Asayama, Kanagawa (JP); Kiyoharu Momosaki, Oita (JP); Rei Takamori, Oita (JP); Masakazu Baba, Oita (JP)

(73) Assignee: SONY CORPORATION, Tokyo (JP)

(*) Notice: Subject to any disclaimer, the term of this patent is extended or adjusted under 35 U.S.C. 154(b) by 18 days.

(21) Appl. No.: 15/558,916

(22) PCT Filed: Mar. 2, 2016

(86) PCT No.: PCT/JP2016/056510
§ 371 (c)(1),
(2) Date: Sep. 15, 2017

(87) PCT Pub. No.: WO2016/152431
PCT Pub. Date: Sep. 29, 2016

(65) Prior Publication Data
US 2018/0083056 A1     Mar. 22, 2018

(30) Foreign Application Priority Data
Mar. 24, 2015   (JP) .............................. JP2015-060784

(51) Int. Cl.
*H01L 27/146*       (2006.01)
*H04N 5/335*        (2011.01)
(Continued)

(52) U.S. Cl.
CPC ...... *H01L 27/14618* (2013.01); *H01L 21/563* (2013.01); *H01L 23/3114* (2013.01);
(Continued)

(58) Field of Classification Search
CPC ............. H01L 27/14618; H01L 21/563; H01L 2924/181; H01L 2224/45099; H01L 2224/73253; H01L 2224/16225
See application file for complete search history.

(56) References Cited

U.S. PATENT DOCUMENTS 7,728,440 B2 * 6/2010 Honda .................... H01L 23/24
                                                            257/778
8,004,096 B2 * 8/2011 Fukuzono ............... H01L 24/31
                                                            257/791
(Continued)

FOREIGN PATENT DOCUMENTS

CN        1967856 A     5/2007
CN      101271913 A     9/2008
(Continued)

OTHER PUBLICATIONS

International Search Report and Written Opinion of PCT Application No. PCT/JP2016/056510, dated May 17, 2016, 10 pages of ISRWO.

*Primary Examiner* — Marcos D. Pizarro
*Assistant Examiner* — Quinton A Brasfield
(74) *Attorney, Agent, or Firm* — Chip Law Group

(57) ABSTRACT

A size reduction of an image pickup module by using resin molding, including a reduction in height, area, or the like thereof is achieved in an actual product. Provided is a module, including a substrate; a semiconductor component in which a first surface of a semiconductor device manufactured by chip-size packaging is provided and fixed along a plate-shaped translucent member, and a second surface of the semiconductor device is fixed with the second surface caused to face the substrate; a frame portion made of resin and formed on the substrate to surround the semiconductor component; and an interposition member which is made of resin and with which a gap between the semiconductor
(Continued)

component and the substrate is filled. The interposition member is connected and fixed to the frame portion to be integrated therewith.

13 Claims, 8 Drawing Sheets

(51) Int. Cl.
*H01L 21/56* (2006.01)
*H01L 23/31* (2006.01)
*H01L 23/00* (2006.01)

(52) U.S. Cl.
CPC .... *H01L 23/3135* (2013.01); *H01L 27/14683* (2013.01); *H04N 5/335* (2013.01); *H01L 24/16* (2013.01); *H01L 24/73* (2013.01); *H01L 2224/16225* (2013.01); *H01L 2224/16227* (2013.01); *H01L 2224/73204* (2013.01); *H01L 2224/81191* (2013.01); *H01L 2224/83104* (2013.01)

(56) References Cited

U.S. PATENT DOCUMENTS

| | | |
|---|---|---|
| 2005/0059188 A1 | 3/2005 | Bolken et al. |
| 2005/0191787 A1 | 9/2005 | Bolken et al. |
| 2007/0108579 A1 | 5/2007 | Bolken et al. |
| 2007/0109439 A1 | 5/2007 | Minamio et al. |
| 2008/0197477 A1* | 8/2008 | McLellan ............... H01L 23/16 257/690 |
| 2008/0231693 A1* | 9/2008 | Takayama ............ H04N 5/2257 348/65 |
| 2009/0166784 A1 | 7/2009 | Honda |
| 2010/0078786 A1* | 4/2010 | Maeda .................... H01L 23/16 257/678 |
| 2010/0193240 A1 | 8/2010 | Takayama |
| 2011/0298077 A1 | 12/2011 | Bolken et al. |
| 2013/0234275 A1 | 9/2013 | Bolken et al. |

FOREIGN PATENT DOCUMENTS

| | | | |
|---|---|---|---|
| CN | 101512765 A | | 8/2009 |
| JP | 2003-210394 A | | 7/2003 |
| JP | 2007-142058 A | | 6/2007 |
| JP | 2008-130738 A | | 6/2008 |
| JP | 2008-235686 A | | 10/2008 |
| JP | 2009-44301 A | | 2/2009 |
| JP | 2009-044301 A | | 2/2009 |
| JP | 2010-147200 A | | 7/2010 |
| JP | 2010-161784 A | | 7/2010 |
| JP | 2010147200 A | * | 7/2010 |
| JP | 2010-206158 A | | 9/2010 |
| JP | 2011-187482 A | | 9/2011 |
| WO | 2008/032404 A1 | | 3/2008 |
| WO | 2008032404 A1 | | 3/2008 |

* cited by examiner

SOLID-STATE IMAGE PICKUP APPARATUS, METHOD OF MANUFACTURING SOLID-STATE IMAGE PICKUP APPARATUS, AND ELECTRONIC APPARATUS

CROSS REFERENCE TO RELATED APPLICATIONS

This application is a U.S. National Phase of International Patent Application No. PCT/JP2016/056510 filed on Mar. 2, 2016, which claims priority benefit of Japanese Patent Application No. JP 2015-060784 filed in the Japan Patent Office on Mar. 24, 2015. Each of the above-referenced applications is hereby incorporated herein by reference in its entirety.

TECHNICAL FIELD

The present technology relates to a solid-state image pickup apparatus, a method of manufacturing a solid-state image pickup apparatus, and an electronic apparatus.

BACKGROUND ART

In related art, for an image pickup apparatus such as a digital still camera and a camera-equipped mobile phone, a reduction in thickness of an entire apparatus is demanded, so a reduction in height of an image pickup module is also important. As a technology for reducing a height of an image pickup module, for example, Patent Literature 1 has been disclosed.

The technology described in Patent Literature 1 is a configuration as follows. A solid-state image pickup device is placed on a wiring substrate, and a translucent cover portion is provided so as to cover an image pickup surface of the solid-state image pickup device. A wire that connects a rim portion of the solid-state image pickup device and the wiring substrate is subjected to resin molding, and mold resin is extended to a rim portion on an upper surface of the cover portion in an overhang form, thereby suppressing entry of reflection light. With this configuration, it is possible to achieve a countermeasure against a flare without increasing a thickness of a light-shielding seal member, and set the thickness of the light-shielding seal member to be smaller than that in related art.

CITATION LIST

Patent Literature

Patent Literature 1: Japanese Patent Application Laid-open No. 2011-187482

DISCLOSURE OF INVENTION

Technical Problem

However, for an image pickup apparatus, not only a reduction in thickness but also a reduction in area is demanded, and a reduction in entire size of a module is also important. Patent Literature 1 described above has proposed the technology for reducing the height but has not proposed a technology for reducing an area thereof. Therefore, a reduction in size of an entire module is insufficient.

In addition, the technology in related art described above is a technology for achieving a reduction in height of an image pickup module by resin molding. In actuality, there is a problem of resin peeling due to a coefficient of thermal expansion or an elastic modulus. However, there is no description that this problem has been resolved. In this way, although the reduction in size of the image pickup module by resin molding has been proposed, there is no case in which an image pickup module, the height of which is reduced by resin molding is actually commercialized, as far as the inventor of the present technology knows.

The present technology has been made in view of the circumstances as described above, and proposes various devises for downsizing such as reductions in height and area of an image pickup module using resin molding so as to achieve actual commercialization.

Solution to Problem

According to an aspect of the present technology, there is provided a module, including: a substrate; a semiconductor component in which a first surface of a semiconductor device manufactured by chip-size packaging is provided and fixed along a plate-shaped translucent member, and a second surface of the semiconductor device is fixed with the second surface caused to face the substrate; a frame portion made of resin and formed on the substrate to surround the semiconductor component; and an interposition member which is made of resin and with which a gap between the semiconductor component and the substrate is filled, in which the interposition member is connected and fixed to the frame portion to be integrated therewith.

Further, according to another aspect of the present technology, there is provided a method of manufacturing a module, including: a step of setting a semiconductor component in such a manner that a first surface of a semiconductor device manufactured by chip-size packaging is provided and fixed along a plate-shaped translucent member, and a second surface of the semiconductor device is fixed with the second surface caused to face the substrate; a step of forming a frame portion made of resin on the substrate to surround the semiconductor component; and a step of forming an interposition member by filling a gap between the semiconductor component and the substrate with resin and solidifying the resin, and connecting and fixing the interposition member to the frame portion to be integrated therewith.

Further, according to another aspect of the present technology, there is provided an electronic apparatus including a module. The module includes a substrate, a semiconductor component in which a first surface of a semiconductor device manufactured by chip-size packaging is provided and fixed along a plate-shaped translucent member, and a second surface of the semiconductor device is fixed with the second surface caused to face the substrate, a frame portion made of resin and formed on the substrate to surround the semiconductor component, and an interposition member which is made of resin and with which a gap between the semiconductor component and the substrate is filled, the interposition member being connected and fixed to the frame portion to be integrated therewith.

It should be noted that, the module and the electronic apparatus described above include various modes such as a mode of implementation of being incorporated in another apparatus, a mode of implementation as a system equipped with the module and the electronic apparatus, and a mode of implementation with another method. Further, the present technology includes various modes such as a mode in which the manufacturing method is carried out as a part of another method, a mode of implementation as a manufacturing apparatus provided with means corresponding to respective steps of the manufacturing method, and a mode of implementation as a control program of the manufacturing apparatus, a computer-readable recording medium in which the control program is recorded, or the like.

Advantageous Effects of Invention

According to the present technology, in an actual product, the size reduction such as the reduction in height and area of the image pickup module using resin molding can be achieved. It should be noted that, the effects described in this specification are merely examples and not limited, and an additional effect may be obtained.

MODE(S) FOR CARRYING OUT THE INVENTION

Hereinafter, the present technology will be described in the following order.
(A) First embodiment:
(B) Second embodiment:
(C) Third embodiment:
(D) Fourth embodiment:
(E) Fifth embodiment:
(F) Sixth embodiment:

(A) First Embodiment

Figure 1:
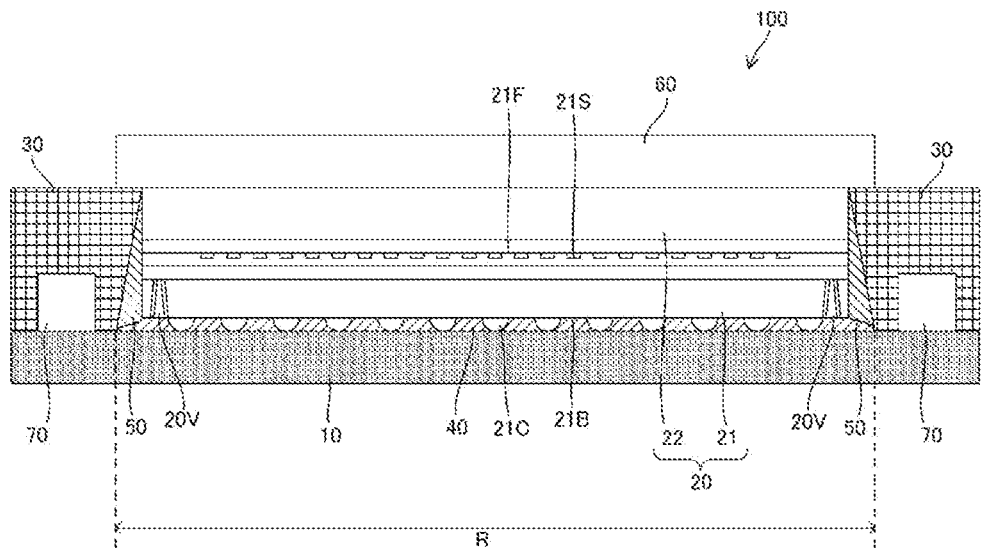
FIG. 1 A diagram schematically showing a configuration of a module according to this embodiment.

FIG. 1 is a diagram schematically showing a configuration of a module 100 according to this embodiment. The module 100 includes a substrate 10, a semiconductor component 20, a frame portion 30, an interposition member 40 which is made of resin and with which a gap between the semiconductor component 20 and the substrate 10 is filled and bonded, and an interposition member 50 which is made of resin and with which a gap between the frame portion 30 and the semiconductor component 20 is filled and bonded. In this embodiment, the interposition member 40 is integrated with the frame portion 30 by connection fixing through the interposition member 50. The substrate 10 is configured by an organic substrate. It should be noted that the organic substrate in this embodiment includes not only a substrate formed only by an organic substance such as resin but also a "substrate including an organic substance" including other materials such as metal and ceramics. Further, any of or a combination of the frame portion 30, the interposition member 40, and the interposition member 50 may be made of the same material or may be integrally formed in the same process.

The substrate 10 can be configured by the organic substrate made of resin or the like, and thus can achieve narrow pitches of wirings. Therefore, the substrate has a high degree of freedom of wiring, and a cost thereof is lower than a ceramic substrate. Further, the substrate 10 is configured by the organic substrate, and thus has a high affinity for the frame portion 30 made of resin and the interposition member 40 made of resin described above. Therefore, from the substrate 10, the frame portion 30 and the interposition member 40 are difficult to be peeled off. Further, the substrate 10 configured by the organic substrate made of resin has a high affinity for the interposition member 50 in a case where the interposition member 50 is bonded with the substrate 10.

The semiconductor component 20 has a semiconductor device 21 having a flat, thin plate shape and a glass 22 as a plate-shaped translucent member. As a first surface of the semiconductor device 21, a surface 21F is provided along the glass 22 and is fixed to position with an adhesive made of resin or the like. The semiconductor component 20 is fixed to the substrate 10 with a back surface 21B as a second surface of the semiconductor device 21 caused to face the substrate 10. In the semiconductor component 20, the glass 22 is layered on the semiconductor device 21 and integrated therewith with an adhesive or the like. Therefore, rigidity is improved as compared to a case where the semiconductor device 21 and the glass 22 are independently provided, and a resistance characteristic thereof with respect to warpage or flexure is improved. It should be noted that the semiconductor device 21 and the glass 22 are desirably bonded with each other entirely with resin or the like.

An optically functional filter (infrared cut filter or the like) is provided on the semiconductor component 20. The optically functional filter cuts unnecessary light such as infrared rays from incident light that enters the semiconductor device 21, or adjusts incident light that enters the semiconductor device 21. It should be noted that in a case where the glass 22 that constitutes the semiconductor component 20 is caused to have an optical filter function, the optically functional filter is not provided on the semiconductor component 20 in some cases.

The frame portion 30 is a member made of resin provided on the substrate 10, and has a portion and a shape surrounding the semiconductor component 20. It should be noted that, in the example shown in FIG. 1, the frame portion 30 is formed into such an overhang shape that an inside surface is increasingly overhung as closer to an upper surface. Under a conceived use condition of the module 100, the frame portion 30 has a stiffness at a certain level or more which conforms to a use purpose requested for the module 100. A certain range R of the substrate 10 which is surrounded by the frame portion 30 is supported by the frame portion 30. Thus, the certain range R of the substrate 10 which is surrounded by the frame portion 30 is maintained to be in a substantially flat state in which warpage or flexure is unlikely to occur by a support force of the stiffness of the frame portion 30. As a result, as the substrate 10, a thin substrate such as a coreless substrate and a flexible substrate can be used.

To the certain range R of the substrate 10, the semiconductor component 20 described above is fixed through the interposition member 40 with the back surface 21B caused to face the substrate 10. That is, in this embodiment, onto the substrate 10 supported by the stiffness of the frame portion 30 in the substantially flat state, the semiconductor device 21, the stiffness of which is improved by being bonded with the glass 22 is fixed. A gap between the substrate 10 and the semiconductor device 21 is filled with the interposition member 40, and the interposition member is solidified.

The gap between the substrate 10 and the semiconductor device 21 is filled with the interposition member 40 made of resin, and the interposition member is solidified, with the result that heat radiation performance is improved as compared to the case where a gap between the substrate 10 and semiconductor device 21 is made to be hollow. Further, as will be described later, in the case where the semiconductor device 21 and the substrate 10 are connected through a plurality of connection terminals 21C made of metal which is provided on the back surface 21B of the semiconductor device 21, a heat pass between the semiconductor device 21 and the substrate 10 is increased, and thus the heat radiation performance of the semiconductor device 21 is improved.

The interposition member 40 provided between the semiconductor device 21 and the substrate 10 is connected and fixed to the frame portion 30 and integrated therewith. In this embodiment, the interposition member 40 is bonded with the frame portion 30 in the vicinity of a surface of the substrate 10, and connected to the frame portion 30 through the interposition member 50. As a result, stiffness requested for each of the substrate 10, the semiconductor device 21, and the glass 22 is reduced, so thicknesses of the respective members can be reduced. Thus, it is possible to reduce the height of the module 100 as a whole.

Specifically, as the semiconductor device 21, various kinds of chip-size packaging (CPS) can be used. As the CPS, for example, there is a wafer-level chip-size packaging (WLCSP) formed by a method in which forming terminals, wiring, and the like are performed before cutting out a wafer (silicon wafer) for which a semiconductor device is formed, and wafer dicing is performed. Further, as the substrate 10, for example, a coreless substrate obtained by removing a core layer (support layer using glass and epoxy resin) from a buildup substrate, a flexible substrate, or the like can be used. Further, as the glass 22, for example, a thin plate glass having a thickness of several hundred μm or an ultrathin plate glass or the like having a thickness of tens of μm can be used.

Further, by providing the frame portion 30 and the interposition member 40 separately, the frame portion 30 and the interposition member 40 can be made of different resin materials from each other. For example, the frame portion 30 is made of thermo-setting resin (transfer mold resin or the like) having a high stiffness for the purpose of semiconductor seal, while the interposition member 40 can be made of resin having a high stress reliability which is capable of coping with a case where a connection terminal 21C between the semiconductor component 20 and the substrate 10 is fine. By using the resin having the high stress reliability for the interposition member 40, it is possible to reduce a possibility that bonding metal (solder or the like) used to connect the substrate 10 and the connection terminal 21C of the semiconductor device 21 is peeled off.

Further, the interposition member 50 and the interposition member 40 can be made of different resin materials. That is, the resin that forms the interposition member 40 bonded to the back surface 21B of the semiconductor device 21, the connection terminal 21C, bonding metal for electrically connecting the connection terminal 21C to the substrate 10, and the like can be configured by a different resin material from the resin bonded to the semiconductor component 20 to connect and integrate the semiconductor component 20 with the frame portion 30.

A gap between the semiconductor component 20 and the frame portion 30 is filled with resin, and the resin is solidified, thereby providing the interposition member 50 bonded to at least a part of a side surface of the semiconductor component 20. The interposition member 50 is connected to at least one of the frame portion 30 and the interposition member 40. At least one of the interposition member 40 and the interposition member 50 is connected to the frame portion 30. As a result, the semiconductor component 20 is supported by the interposition member 50 from the side surface, and is buried in the resin of the frame portion 30, the interposition member 40, the interposition member 50, and the like. Therefore, as a whole, a stress reliability is improved with respect to connection abnormalities such as a peeling and a crack on a connection part of the module 100. As a result, in the case where an optical system or the like, an attachment part of which is made of resin is provided on the module 100, the attachment is easily performed. An effect of improving the stress reliability of the attachment part and achieving stabilization thereof is also provided.

The frame portion 30 is formed as a light-shielding member made of non-translucent resin. In this way, the semiconductor component 20 is surrounded by the light-shielding frame portion 30, with the result that scattering of light that is incident on the module 100 is suppressed, and a flare and a ghost of incident light on a sensor device 21S of the semiconductor device 21 can be suppressed. On the other hand, the interposition member 50 may be made of non-translucent resin as a light-shielding member depending on a degree of suppression of the flare and ghost, or may be formed as a translucent member made of translucent resin.

Figure 2:
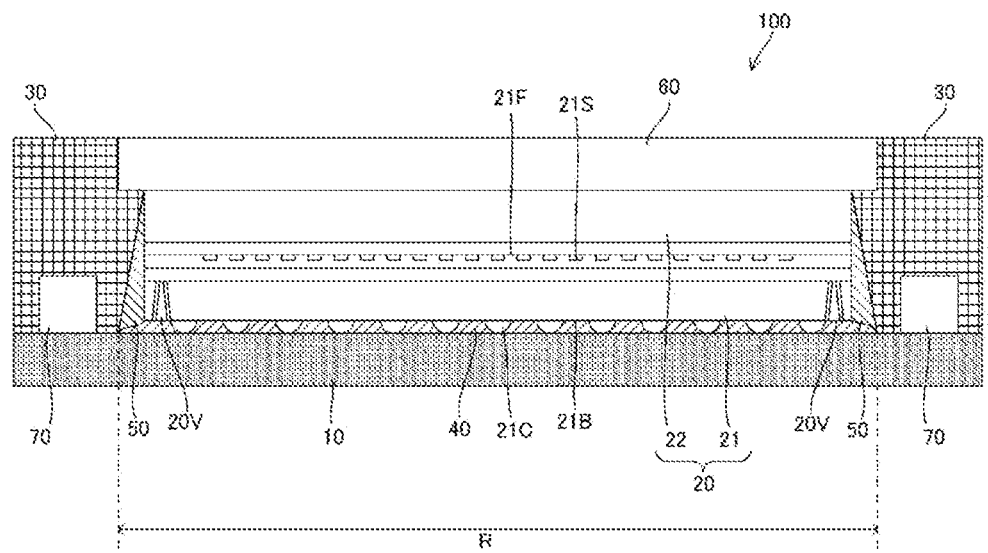
FIG. 2 A diagram showing another example of a buried depth of a semiconductor component.
Figure 3:
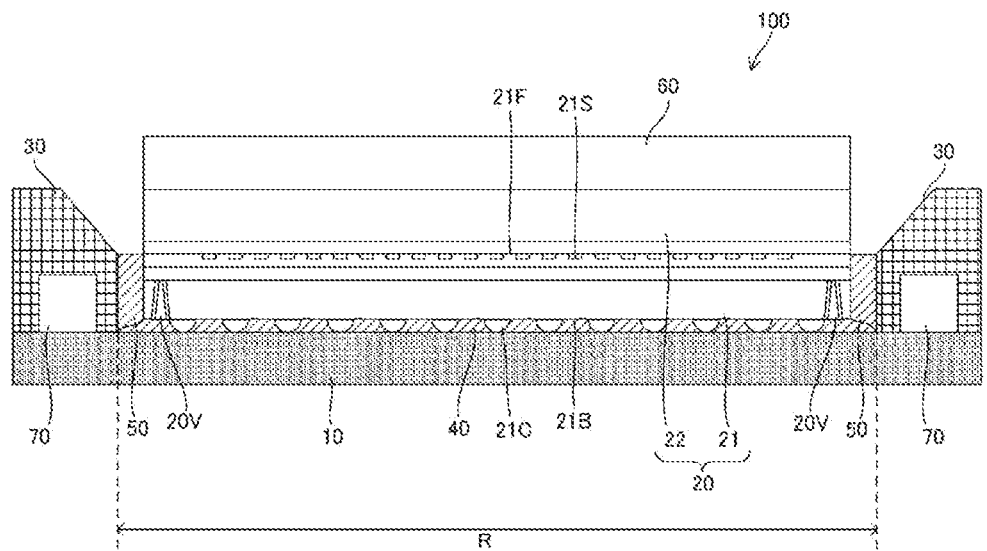
FIG. 3 A diagram showing another example of a buried depth of the semiconductor component.

It should be noted that the buried depth of the semiconductor component 20 (height of the frame portion 30 and the interposition member 50) can be variously changed. FIG. 2 and FIG. 3 each are a diagram showing another example of the buried depth of the semiconductor component 20. In the example shown in FIG. 2, not only the semiconductor component 20 but also the optically functional filter provided thereon are entirely buried. In the example shown in FIG. 3, only a lower portion of the semiconductor component 20 is buried, and more specifically, only the semiconductor device 21 that constitutes the lower portion of the semiconductor component 20 is in a buried state.

Figure 4:
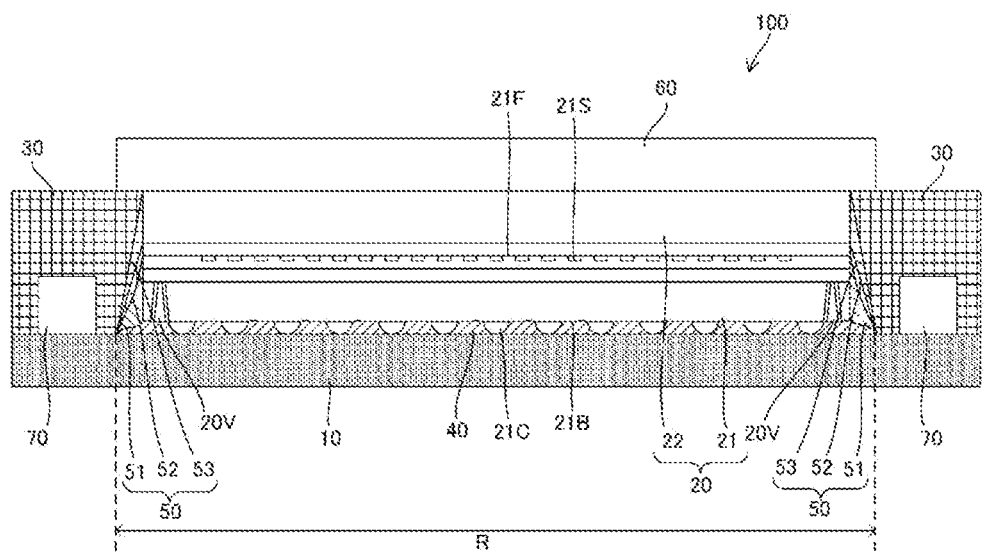
FIG. 4 A diagram showing another example of a configuration of an interposition member disposed between the semiconductor component and a frame portion.

Further, for the interposition member 40 and the interposition member 50, depending on a portion to be bonded, resin to be used can be selected as appropriate. For example, as shown in FIG. 4, the interposition member 50 can be formed by using different resins for portions to be bonded to the members that constitute the semiconductor component 20. More specifically, for example, a resin 51 to be used for a portion bonded to the semiconductor device 21, a resin 53 to be used for a portion bonded to the glass 22, and a resin 52 to be used for a portion bonded between the semiconductor device 21 and the glass 22 may be different resin materials from one another.

As described above, in the case where the resin to be used is selected as appropriate depending on the portion to be bonded, between the semiconductor component 20 and the substrate 10 and between the semiconductor component 20 and the frame portion 30, the interposition member 40 and the interposition member 50 are multilayered. A direction of the multilayer of the interposition member 50 may be a multilayer configuration in which layering is conducted in a substantially vertical direction with the resin layers that constitute the interposition member 40 extended in a substantially horizontal direction, or may be a multilayer configuration in which layering is conducted in the substantially horizontal direction with the resin layers that constitute the interposition member 50 extended in the substantially vertical direction. Further, layering in the substantially vertical direction and layering in the substantially horizontal direction may be combined to form the multilayer.

In this way, by the bonding resin is selected as appropriate so as to correspond to the components of the semiconductor component 20, the interposition member 50 having a layer structure corresponding to the components of the semiconductor component 20 is formed, and thus it is possible to reduce a possibility of an occurrence of peeling off in the module 100 as much as possible.

Further, in the module 100 according to this embodiment, in the frame portion 30, at least a part of various circuit components 70 such as a resistance, a capacitance, and a chip mounted on the substrate 10 is buried. As a result, the circuit component 70 buried in the frame portion 30 functions as a structure material in the resin that constitutes the frame portion 30, thereby improving stiffness of the frame portion 30 and reducing a mounting space on the substrate 10. This makes a great contribution to the size reduction including the reduction in height and area of the module 100.

Figure 15:
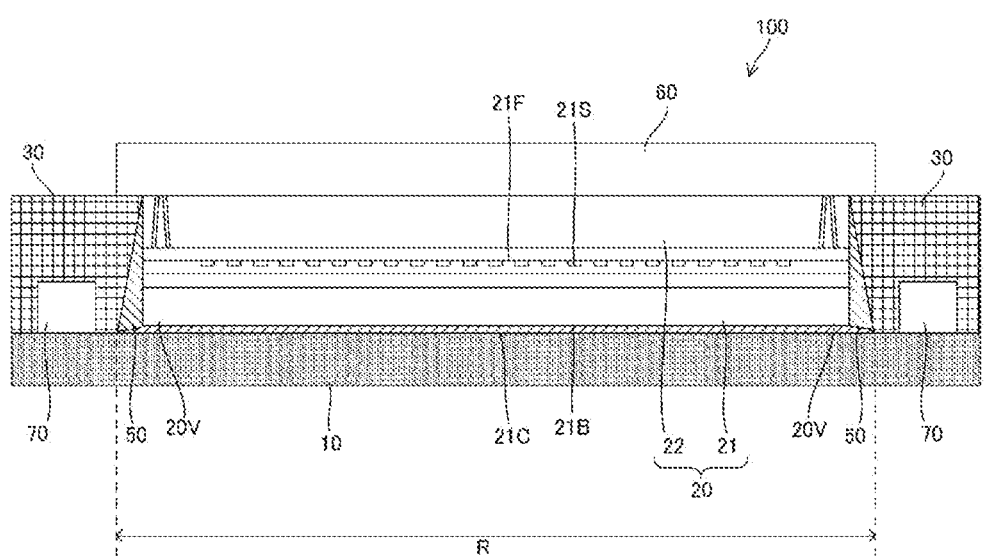
FIG. 15 A diagram schematically showing another example of wiring in the module.

Further, in the module 100, an upper surface of the frame portion 30, an upper surface of the glass 22, and an upper surface of the interposition member 50 with which the gap between the frame portion 30 and the glass 22 is filled and which is solidified are flush with one another. Therefore, wiring for connection between the surface of the glass 22 and the frame portion 30 is easily performed. Further, as shown in FIG. 15, a via is formed in the glass 22, and the wiring of the surface of the glass and the wiring of the surface of the semiconductor device 21 are connected, thereby making it possible to connect to a circuit of the substrate 10 through a mold wiring on the surface or inside of the frame portion 30. As a result, as shown in FIG. 15, it is possible to eliminate the connection terminal 21C of the semiconductor device 21. By eliminating the connection terminal 21C of the semiconductor device 21, a gap between the semiconductor device 21 and the substrate 10 is reduced, and thus the height of the module 100 can be reduced.

Subsequently, a configuration relating to an electric connection of the module 100 shown in FIG. 1 will be described.

In the module 100, on the surface 21F of the semiconductor device 21, the sensor devices 21S such as a photodiode that constitutes an image sensor such as a CCD (Charge Coupled Devices) and a CMOS (Complementary Metal Oxide Semiconductor) are provided by a technology of WLCSP. On the sensor device 21S, a color filter layer constituted of a plurality of color filters is provided so as to correspond to the positions of the sensor devices 21S.

On the semiconductor device 21, a via 20V that penetrates between the surface 21F and the back surface 21B is formed, and on the back surface 21B, a plurality of connection terminals 21C (bump or the like) is provided. A circuit including the sensor device 21S described above which is provided on the surface 21F of the semiconductor device 21 is electrically connected with a circuit provided on the substrate 10 through the via 20V and the connection terminals 21C. In this way, the substrate 10 can achieve a narrow pitch as compared to a ceramic substrate, and can be wired at pitches corresponding to pitches of the connection terminals 21C formed by the technology of WLCSP. When the pitches of the connection terminals 21C such as bumps is set to be narrow, a size of the connection terminals 21C in a thickness direction can also be reduced. This makes a contribution to a reduction in height of the entire module 100.

Further, by using the connection through the via 20V and the connection terminals 21C, it is unnecessary to draw and put a wire around the side surface of the semiconductor device 21, and a mounting area of the semiconductor component 20 is reduced, with the result that advantages of reducing the number of parts, improving efficiency of a manufacturing process, and the like can be obtained. Further, a wiring length of the surface 21F of the semiconductor device 21 and the substrate 10 is reduced, so electric characteristics are improved. On the substrate 10, fine and free designing can be carried out. As a result, it is possible to improve signal transmission quality, and improve quality of various signal processes in a later state using an output signal of the module 100 (for example, image quality in image processing).

(B) Second Embodiment

Subsequently, a method of manufacturing the module 100 according to the first embodiment will be described.

FIGS. 5(a), 5(b), 5(c), 5(d), 5(e), 6(f), 6(g) and 6(h) are diagrams showing an example of the method of manufacturing the module 100.

Figure 5A:
FIGS. 5(a), 5(b), 5(c), 5(d) and 5(e) Diagrams showing an example of a method of manufacturing a module.
Figure 5B:
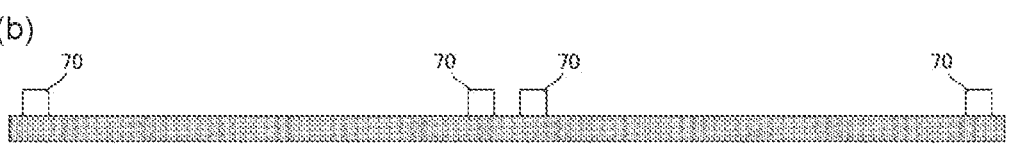

In the manufacturing method in this embodiment, first, the substrate 10 is prepared (see FIG. 5(a)), and on the substrate 10, the circuit components 70 are mounted (see FIG. 5(b)). At least a part of the circuit components 70 mounted in this case is mounted within a range of forming the frame portion 30 to be formed in a subsequent process. However, a plurality of modules 100 are formed on the substrate 10 at the same time, and cutting into pieces is performed for each module 100 finally, so on a cut line CL, the circuit components 70 except circuit components which can be cut (for example, terminal components or the like) are not mounted.

Figure 5C:
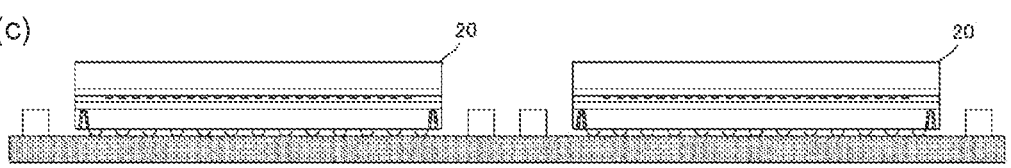

Subsequently, in the certain range R of the substrate 10, the semiconductor component 20 is mounted (see FIG. 5(c)). The semiconductor component 20 has a configuration in which the glass 22 is bonded to the thin surface 21F of the semiconductor device 21 manufactured by the WLCSP and integrated therewith, and the connection terminal 21C such as a bump is provided on the back surface 21B of the semiconductor device 21. In the semiconductor component 20, the connection terminal 21C is connected to a connection portion such as a land on the substrate 10 by connection metal with the back surface 21B caused to face the substrate 10.

Figure 5D:
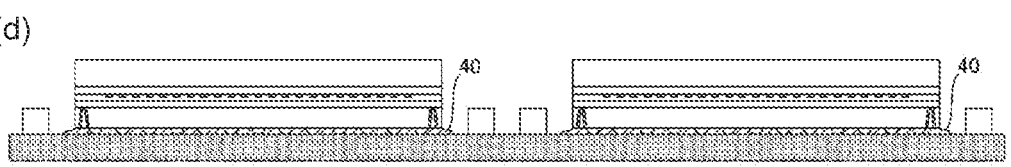

Subsequently, a gap between the semiconductor component 20 and the substrate 10 is filled with resin, and the resin is solidified by a method of resin injection, resin discharge, or the like, thereby forming the interposition member 40 (see FIG. 5(d)). The interposition member 40 bonds and solidifies the semiconductor component 20 and the substrate 10 while including the connection terminal 21C and bonding metal. Therefore, it is possible to prevent peeling of the bonding metal that connects the connection terminal 21C and the substrate 10. Further, over an entire gap between the semiconductor component 20 and the substrate 10, the interposition member 40 is formed, so the interposition member 40 reinforces the semiconductor component 20 and substrate 10, and increases a heat pass that transfers generated heat of the semiconductor component 20 to the substrate 10, thereby improving heat radiation efficiency.

Figure 5E:
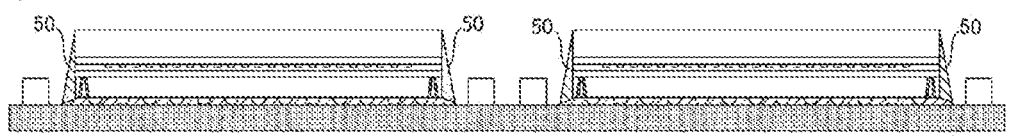

Subsequently, along the side surface of the semiconductor component 20, resin is adhered and solidified, thereby forming the interposition member 50 (see FIG. 5(e)). The interposition member 50 is formed in such a manner as to be in contact with the interposition member 40 while being in contact with a substantially entire side surface of the semiconductor component 20.

Figure 6F:
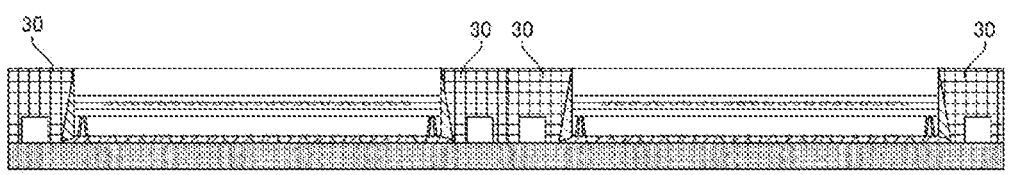
FIGS. 6(f), 6(g) and 6(h)Diagrams showing an example of a method of manufacturing the module.

Subsequently, sides of the semiconductor component 20 is filled with thermo-setting resin, and the resin is hardened, thereby forming the frame portion 30 (see FIG. 6(f)). The frame portion 30 is formed in such a manner that an upper surface thereof is substantially flush with an upper surface of the semiconductor component 20. At this time, thermo-setting resin includes a circuit device mounted within a range in which the frame portion 30 is formed on the substrate 10. Further, the frame portion 30 is connected to the side surface of the semiconductor component 20 and integrated therewith through the interposition member 50, and is connected and integrated with the back surface 21B of the semiconductor device 21, the connection terminal 21C, and the bonding metal that connects the substrate 10 therewith through the interposition member 40 (and interposition member 40).

Figure 6G:
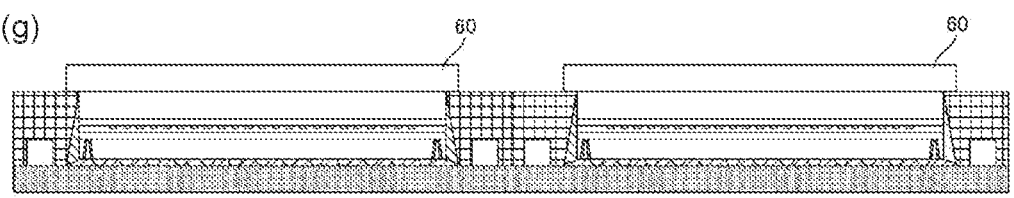
Figure 6H:
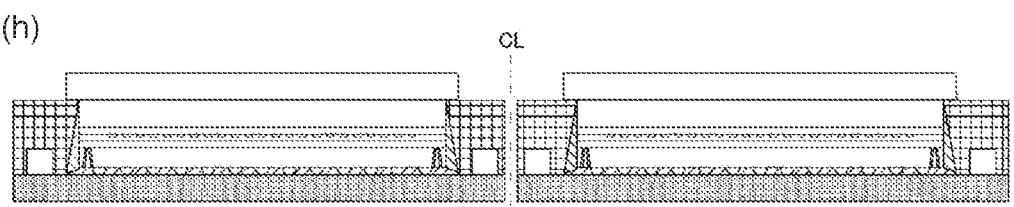

Subsequently, on the glass 22 of the semiconductor component 20 and on the frame portion 30, the optically functional filter is loaded and fixed (see FIG. 6(g)), and finally, the frame portion 30 and the substrate 10 are cut along the predetermined cut line CL, thereby performing cutting into pieces for each module 100 (see FIG. 6(h)). As a result, the module 100 according to the first embodiment described above is manufactured.

Figure 7:
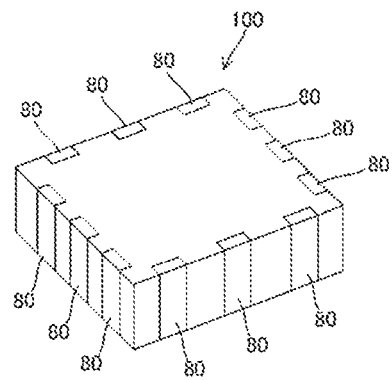
FIG. 7 A diagram for explaining a shape of a side surface terminal.
Figure 8:
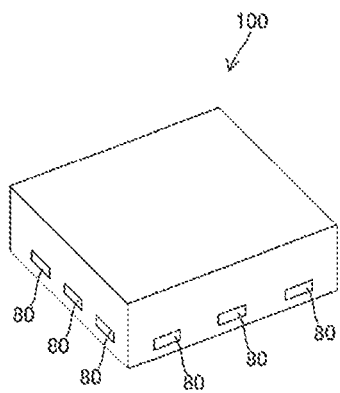
FIG. 8 A diagram for explaining a shape of a side surface terminal.

On a cut surface of the module 100 obtained by performing cutting into pieces as described above, side surface terminals 80 are formed as necessary. FIG. 7 and FIG. 8 are diagrams for explaining the shape of the side surface terminals.

In the example shown in FIG. 7, the module 100 has the side surface terminals 80 in which metals are buried in groove-shaped depressed portions extended in a vertical direction on side surfaces thereof. The side surface terminals 80 may be formed in such a manner that before cutting into pieces is performed to obtain the module 100, metals are buried along the vertical direction on the cut line CL and cut so as to appear on the side surfaces of the module 100 that has been cut into pieces, or may be formed by burying metals in the groove-shaped depressed portions formed on the side surfaces of the module 100 that has been cut into pieces.

In the example shown in FIG. 8, the module 100 has the side surface terminal 80 in the vicinity of a boundary between the substrate 10 on the side surface thereof and the frame portion 30. Before the frame portion 30 is formed, a wire is provided so as to intersect the cut line CL on the substrate 10, and the side surface terminals 80 are cut along the cut line CL to perform cutting into pieces to obtain the module 100 and thus appear on cross-sectional surfaces thereof. Therefore, on the side surfaces of the module 100, a lower boundary of the side surface terminal 80 is adjacent to the substrate 10, and upper, right, and left boundaries thereof are adjacent to the resin layer of the frame portion 30. In this way, the side surface terminals 80 formed by cutting the wire formed in advance on the substrate 10 can achieve narrow widths and narrow pitches in accordance with a wiring limitation of the substrate 10.

(C) Third Embodiment

Subsequently, another method of manufacturing the module 100 according to the first embodiment described above will be described. FIGS. 9(a), 9(b), 9(c), 9(d), 9(e), 10(f), 10(g) and 10(h) are diagrams showing another example of a method of manufacturing the module 100.

Figure 9A:
FIGS. 9(a), 9(b), 9(c), 9(d) and 9(e)Diagrams showing another example of a method of manufacturing the module.
Figure 9B:
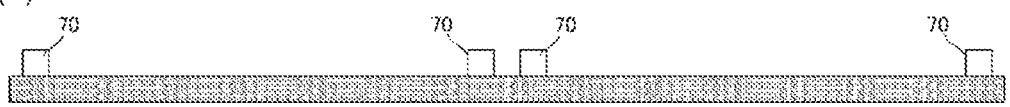

In the manufacturing method according to this embodiment, first, the substrate 10 is prepared (see FIG. 9(a)), and the circuit components 70 are mounted on the substrate 10 (see FIG. 9(b)). At least a part of the circuit components 70 mounted in this case are mounted within a range of forming the frame portion 30 to be formed in a subsequent process. Further, on the substrate 10, the plurality of modules 100 is formed at the same time and finally cut into pieces for each module 100. On the cut line CL, the circuit components 70 except a circuit component that can be cut (for example, terminal component or the like) are not mounted.

Figure 9C:
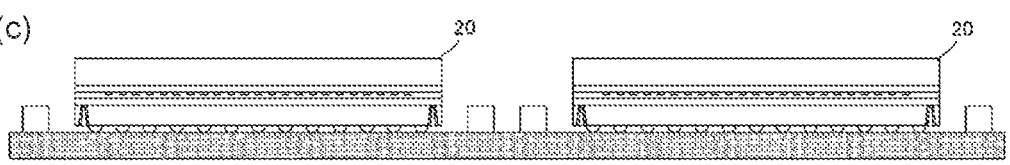

Subsequently, within the certain range R of the substrate 10, the semiconductor component 20 is mounted (see FIG. 9(c)). The semiconductor component 20 has such a configuration that the glass 22 is bonded to the surface 21F of the thin semiconductor device 21 manufactured by the WLCSP and integrated therewith, and on the back surface 21B of the semiconductor device 21, the connection terminal 21C such as a bump is provided. In the semiconductor component 20, the connection terminal 21C is connected to a connection portion such as a land on the substrate with the bonding metal with back surface 21B caused to face the substrate 10.

Figure 9D:
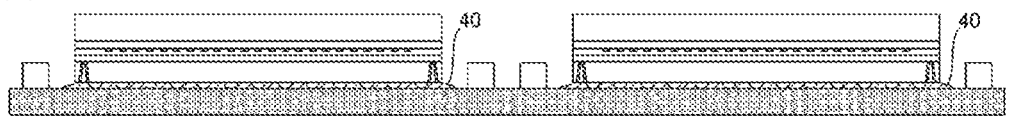
Figure 9E:
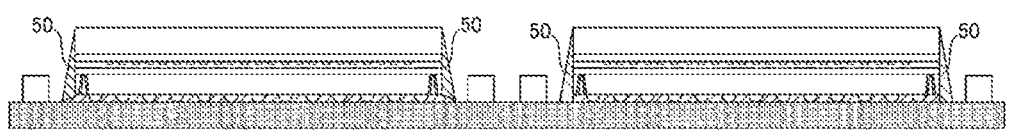

Subsequently, the gap between the semiconductor component 20 and the substrate 10 is filled with resin, and the resin is solidified by a method of injection or the like, thereby forming the interposition member 40 (see FIG. 9(d)). The interposition member 40 includes the connection terminal 21C and the bonding metal, and the semiconductor component 20 and the substrate 10 are bonded and solidified. Thus, it is possible to prevent peeling of the bonding metal that connects the connection terminal 21C and the substrate 10. Further, over an entire area between the semiconductor component 20 and the substrate 10, the interposition member 40 is formed. Therefore, the interposition member 40 reinforces the semiconductor component 20 and the substrate 10, and a heat pass that transfers generated heat of the semiconductor component 20 to the substrate 10 is increased, thereby improving heat radiation efficiency.

Subsequently, along the side surface of the semiconductor component 20, resin is adhered and solidified, thereby forming the interposition member 50 (see FIG. 8(e)). The interposition member 50 is in contact with the interposition member 40 while being in contact with a substantially entire side surface of the semiconductor component 20.

Figure 10F:
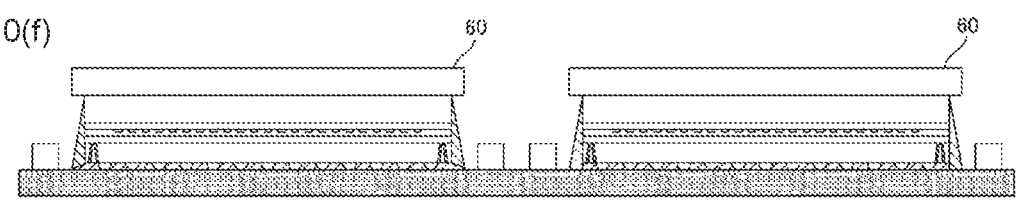
FIGS. 10(f), 10(g) and 10(h) Diagrams showing another example of a method of manufacturing the module.

Subsequently, on the glass 22 of the semiconductor component 20 and the frame portion 30, the optically functional filter is loaded and fixed (see FIG. 10(f)).

Figure 10G:
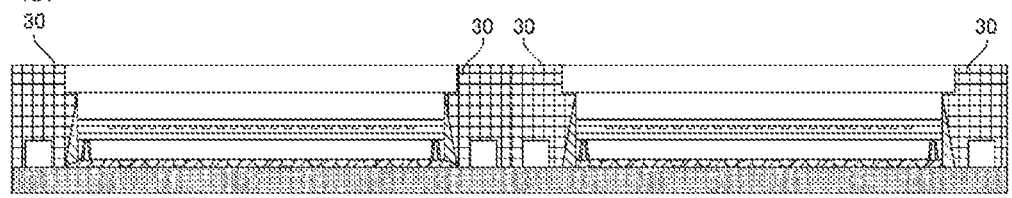

Subsequently, the side of the semiconductor component 20 and the glass 22 is filled with thermo-setting resin, and the resin is hardened, thereby forming the frame portion 30 (see FIG. 10(g)). The frame portion 30 is formed to have such a height that an upper surface thereof is substantially flush with the upper surface of the glass 22. At this time, thermo-setting resin includes a circuit device mounted on the substrate 10. Further, the frame portion 30 is connected to the side surface of the semiconductor component 20 and integrated therewith through the interposition member 50, and is connected and integrated with the back surface 21B of the semiconductor device 21, the connection terminal 21C, and the bonding metal that connects the substrate 10 therewith through the interposition member 40 (and interposition member 40).

Figure 10H:
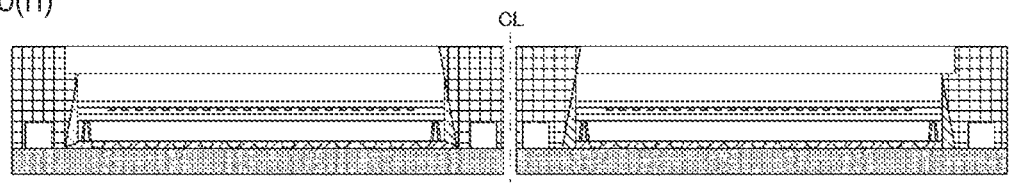

Finally, the frame portion 30 and the substrate 10 are cut along the predetermined cut line CL, thereby cutting into pieces for each module 100 (see FIG. 10(h)). As a result, the module 100 according to the first embodiment described above is manufactured. On a cross-sectional surface of the module 100 cut into pieces as described above, the side surface terminal 80 as shown in FIG. 7 and FIG. 8 as described above are formed as necessary.

(D) Fourth Embodiment

Subsequently, another manufacturing method of the module 100 according to the first embodiment described above will be described. FIGS. 11(a), 11(b), 11(c), 11(d), 12(e), 12(f) and 12(g) are diagrams showing another example of a method of manufacturing the module 100.

Figure 11A:
FIGS. 11(a), 11(b), 11(c) and 11(d) Diagrams showing another example of a method of manufacturing the module.
Figure 11B:
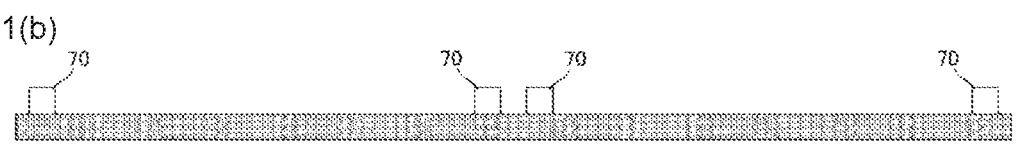

In the manufacturing method according to this embodiment, first, the substrate 10 is prepared (see FIG. 11(a)), and the circuit components 70 are mounted on the substrate 10 (see FIG. 11(b)). At least a part of the circuit components 70 mounted in this case are mounted within a range of forming the frame portion 30 to be formed in a subsequent process. Further, on the substrate 10, the plurality of modules 100 is formed at the same time and finally cut into pieces for each module 100. On the cut line CL, the circuit components 70 except a circuit component that can be cut (for example, terminal component or the like) are not mounted.

Figure 11C:
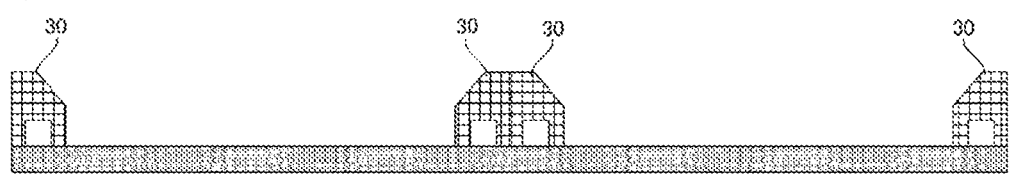

Subsequently, thermo-setting resin is layered and solidified on the side of the semiconductor component 20, thereby forming the frame portion 30 (see FIG. 11(c)). The thermo-setting resin includes at least a part of the circuit components 70 mounted on the substrate 10.

Figure 11D:
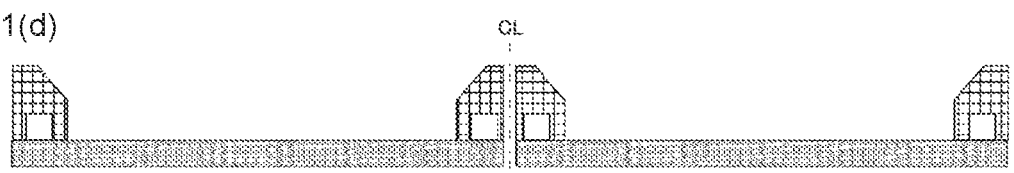

Subsequently, the frame portion 30 and the substrate 10 is cut along the cut line CL and the substrate 10 is cut into pieces (see FIG. 11(d)). On a cross-sectional surface of the module 100 thus obtained by cutting the substrate into pieces, as necessary, the side surface terminals 80 as shown in FIGS. 7 and 8 are formed.

Figure 12E:
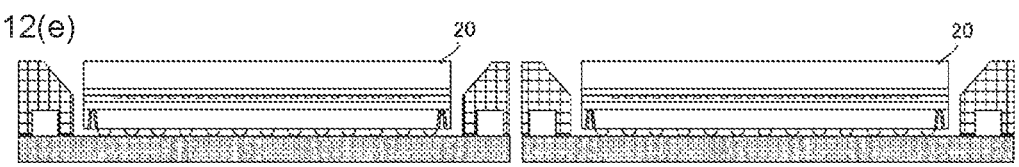
FIGS. 12(e), 12(f) and 12(g) Diagrams showing another example of a method of manufacturing the module.

Subsequently, within the certain range R surrounded by the frame portion 30 of the substrate 10, the semiconductor component 20 is mounted (see FIG. 12(e)). In the semiconductor component 20, the connection terminal 21C is connected to a connection portion such as a land on the substrate 10 with the bonding metal with the back surface 21B caused to face the substrate 10.

Figure 12F:
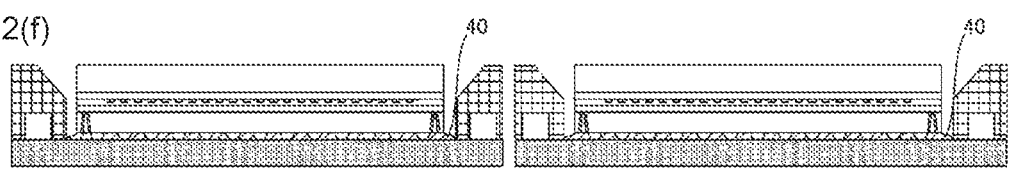

Subsequently, the gap between the semiconductor component 20 and the substrate 10 is filled with resin, and the resin is solidified by a method of injection or the like, thereby forming the interposition member 40 (see FIG. 12(f)).

Figure 12G:
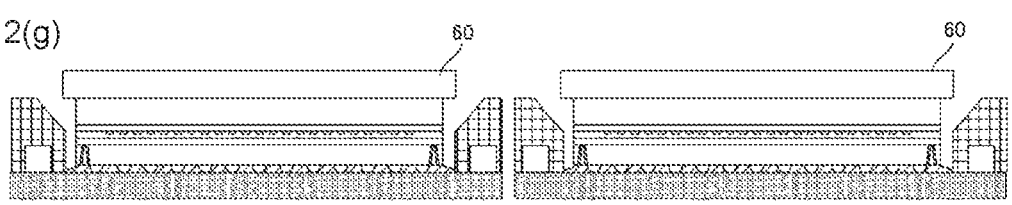

Subsequently, on the glass 22 of the semiconductor component 20 and the frame portion 30, the optically functional filter is loaded and fixed (see FIG. 12(g)). As a result, the module 100 according to the first embodiment described above is manufactured. It should be noted that in the module 100 manufactured in this embodiment, the interposition member 50 is not provided, but the interposition member 50 may of course be provided by filling the gap between the semiconductor component 20 and the frame portion 30 with resin.

(E) Fifth Embodiment

Figure 13:
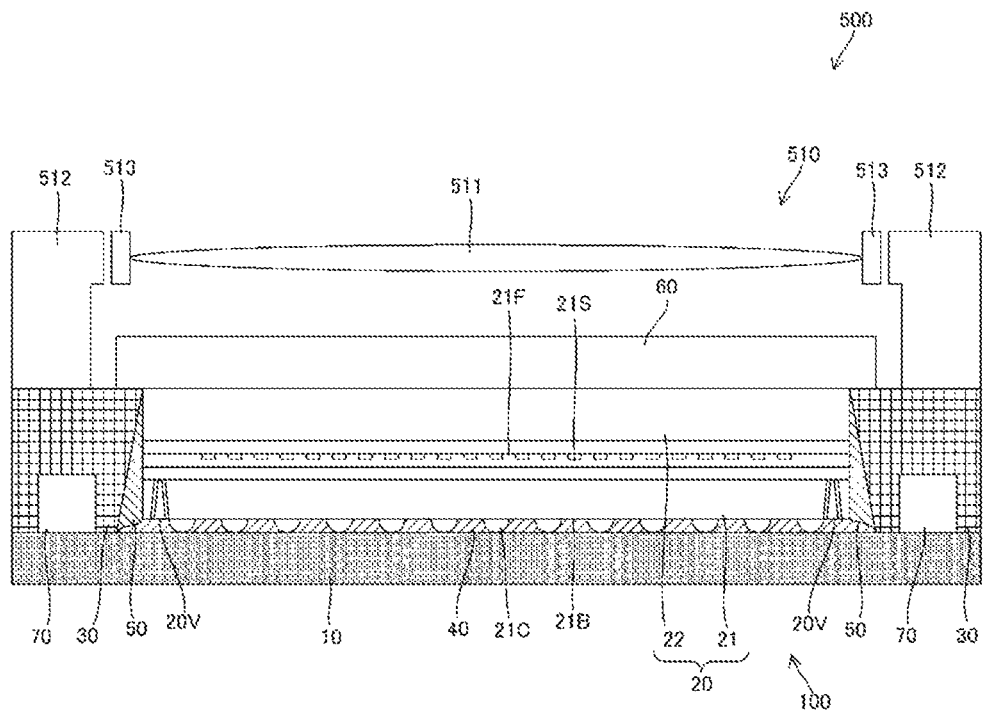
FIG. 13 A diagram showing a schematic configuration of a module according to a fifth embodiment.

Subsequently, description will be given on a module 500 in which an optical system such as a lens is integrated. FIG. 13 is a diagram showing a schematic configuration of the module 500 according to this embodiment. The module 500 shown in the figure has such a configuration that a lens unit is integrated on an upper side of the module 100. Thus, in the following, detailed description of a configuration excluding the lens unit will be omitted.

A lens unit 510 has a configuration in which one or a plurality of lenses 511 is disposed in a case 512, and a drive motor 513 such as a voice coil motor provided on a side surface of the lens 511 drives the lens 511. A lower end of the case 512 is fixed to the frame portion 30, and thus the module 500 in which the lens unit 510 and the module 100 are integrated is manufactured. Because the frame portion 30 of the module 100 is made of resin, so in general, the frame portion 30 has a high affinity for the case 512 made of resin and has a high fixation force thereto.

A driver (not shown) for driving the drive motor 513 is mounted on the substrate 10, for example. In the case where the driver is mounted on the substrate 10, a circuit component of the driver may be buried in the frame portion 30. In this case, by using mold wiring in the frame portion 30, the drive motor 513 and the driver may be connected.

(F) Sixth Embodiment

Figure 14:
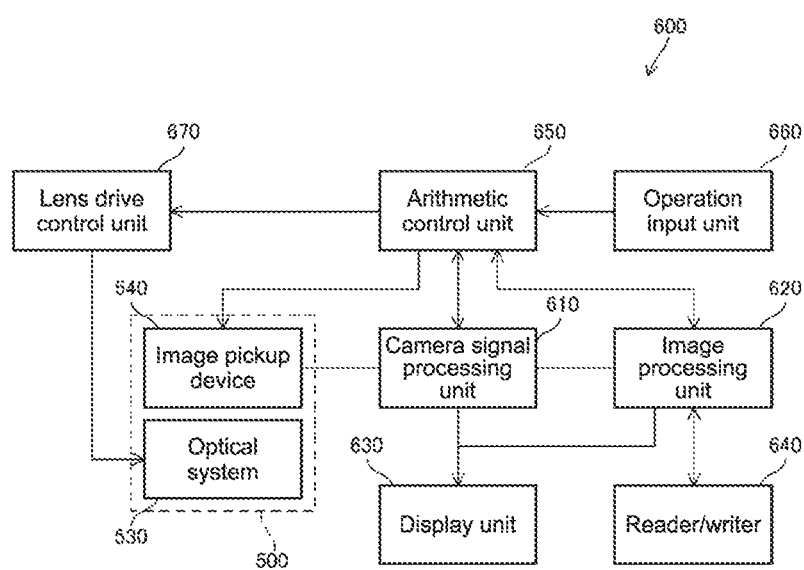
FIG. 14 A diagram showing a schematic configuration of an example of an image pickup apparatus on which a module according to a sixth embodiment is mounted.

FIG. 14 is a block diagram showing a schematic configuration of an example of an image pickup apparatus 600 equipped with the module 500 according to this embodiment. The image pickup apparatus 600 is a digital still camera, a digital video camera, a camera-equipped mobile phone, or the like.

The image pickup apparatus 600 is provided with the module 500, a camera signal processing unit 610, an image processing unit 620, a display unit 630, a reader/writer 640, an arithmetic processing unit 650, an operation input unit 660, and a lens drive control unit 670.

The module 500 is a component that has an image pickup function, and includes an optical system 530 including the lens 511 as an image pickup lens, and an image pickup device 540 such as a CCD (Charge Coupled Devices) and a CMOS (Complementary Metal Oxide Semiconductor). The image pickup device 540 converts an optical image formed by the optical system 530 into an electrical signal, and outputs an image pickup signal (image signal) corresponding to the optical image.

The camera signal processing unit 610 performs various signal processes including an analog/digital conversion, a noise removal, an image quality correction, a conversion to a brightness and color-difference signal with respect to the image signal output from the image pickup device 540.

The image processing unit 620 performs a recording and reproduction process for the image signal. The image processing unit 620 performs a compression coding and expansion decoding process for the image signal based on a predetermined image data format, a conversion process of a data specification such as a resolution, or the like.

The display unit 630 has a function of performing displaying corresponding to an operation input with respect to the operation input unit 660 and displaying various kinds of data such as a taken image.

The reader/writer 640 performs data write to an external storage medium such as a memory card and data read from the external storage medium, and for example, writes image data coded by the image processing unit 620 to the external storage medium or reads the image data stored in the external storage medium, to output the data to the image processing unit 620.

The arithmetic processing unit 650 is a component that functions as a control unit for controlling circuit blocks of the image pickup apparatus 600, and controls the circuit blocks on a basis of an operation input signal or the like from the operation input unit 660. On a basis of the control signal from the arithmetic processing unit 650, the driver of the module 500 controls a drive motor or the like that drives a lens circle.

The operation input unit 660 is constituted of a switch, a touch panel, or the like used for being subjected to a required operation by a user, and for example, is configured by a shutter release operation element for performing a shutter operation, a selection operation element for selecting an operation mode, or the like. The operation input unit 660 outputs an operation input signal corresponding to an operation input performed by the user to the arithmetic processing unit 650.

It should be noted that the present technology is not limited to the above embodiments, and includes a configuration in which the configurations disclosed in the above embodiments are mutually replaced, or a combination thereof is changed, a configuration in which the configurations disclosed in the above embodiments and a known technology are mutually replaced, or a combination thereof is changed, and the like. Further, the technical scope of the present technology is not limited to the above embodiments, and includes matters described in the scope of claims and equivalents thereof.

Further, the present technology can take the following configuration.

(1)

A module, including:

a substrate;

a semiconductor component in which a first surface of a semiconductor device manufactured by chip-size packaging is provided and fixed along a plate-shaped translucent member, and a second surface of the semiconductor device is fixed with the second surface caused to face the substrate;

a frame portion made of resin and formed on the substrate to surround the semiconductor component; and an interposition member which is made of resin and with which a gap between the semiconductor component and the substrate is filled, in which the interposition member is connected and fixed to the frame portion to be integrated therewith.

(2)

The module according to (1), in which the substrate is a coreless substrate.

(3)

The module according to (1) or (2), in which on the first surface of the semiconductor device and on the substrate, circuits are respectively formed to be connected through a via that penetrates the first surface and the second surface of the semiconductor device.

(4)

The module according to (1), in which a gap between the frame portion and the semiconductor device is filled with resin.

(5)

The module according to any one of (1) to (4), in which a gap between the frame portion and the plate-shaped translucent member is filled with resin.

(6)

The module according to any one of (1) to (5), in which a gap between the frame portion and the semiconductor component is filled with resin.

(7)

The module according to any one of (4) to (6), in which the resin with which the gap between the semiconductor component and the frame portion is filled and the resin with which the gap between the semiconductor component and the substrate is filled are each constituted of a plurality of resin layers, and the plurality of resin layers is disposed on positions corresponding to constituents of the semiconductor component.

(8)

The module according to any one of (1) to (7), in which the frame portion, the plate-shaped translucent member, and resin with which a gap between the frame portion and the plate-shaped translucent member is filled and which is solidified are flush with one another.

(9)

The module according to any one of (1) to (8), in which resin provided to face a side surface of the semiconductor component is non-translucent.

(10)

The module according to any one of (1) to (9), in which in the frame portion, a device to be mounted on the substrate is buried.

(11)

The module according to any one of (1) to (10), in which the semiconductor device is connected to the substrate through a bump, and the interposition member fills a gap of connection between the semiconductor device and the substrate through the bump.

(12)

A method of manufacturing a module, including:

a step of setting a semiconductor component in such a manner that a first surface of a semiconductor device manufactured by chip-size packaging is provided and fixed along a plate-shaped translucent member, and a second surface of the semiconductor device is fixed with the second surface caused to face the substrate;

a step of forming a frame portion made of resin on the substrate to surround the semiconductor component; and a step of forming an interposition member by filling a gap between the semiconductor component and the substrate with resin and solidifying the resin, and connecting and fixing the interposition member to the frame portion to be integrated therewith.

(13)

An electronic apparatus, including:

a module including a substrate, a semiconductor component in which a first surface of a semiconductor device manufactured by chip-size packaging is provided and fixed along a plate-shaped translucent member, and a second surface of the semiconductor device is fixed with the second surface caused to face the substrate, a frame portion made of resin and formed on the substrate to surround the semiconductor component, and an interposition member which is made of resin and with which a gap between the semiconductor component and the substrate is filled, the interposition member being connected and fixed to the frame portion to be integrated therewith.

REFERENCE SIGNS LIST 10 substrate
20 semiconductor component
20V via
21 semiconductor device
21B back surface
21C connection terminal
21F surface
21S sensor device
22 glass
30 frame portion
40 interposition member
50 interposition member
51 resin
52 resin
53 resin
60 optically functional filter
70 circuit component
80 side surface terminal
100 module
500 module
510 lens unit
511 lens
512 case
513 drive motor
530 optical system
540 image pickup device
600 image pickup apparatus
610 camera signal processing unit
620 image processing unit
630 display unit
640 reader/writer
650 arithmetic processing unit
660 operation input unit
670 lens drive control unit
R certain range
CL cut line

The invention claimed is:
1. A module, comprising:
a substrate;
a semiconductor component that includes:
 a semiconductor device; and
 a plate-shaped translucent member, wherein
  a first surface of the semiconductor device is along the plate-shaped translucent member, and
  a second surface of the semiconductor device faces the substrate;
a frame portion on the substrate, wherein
 a shape of the frame portion is an overhang shape,
 an inner surface of the frame portion increasing overhangs to an upper surface of the substrate,
 the frame portion surrounds the semiconductor component,
 the frame portion comprises a first resin, and
 at least a part of a first circuit is buried in the frame portion;

a first interposition member that fills a first gap between the semiconductor component and the substrate, wherein the first interposition member comprises a second resin; and a second interposition member, wherein
 the second interposition member comprises a plurality of resin layers,
 the plurality of resin layers includes:
  a third resin between the frame portion and the semiconductor device;
  a fourth resin between the frame portion and the plate-shaped translucent member; and
  a fifth resin between the frame portion and a region corresponding to the first surface of the semiconductor device,
 each of the third resin, fourth resin, and the fifth resin is different,
 the first interposition member is connected and fixed to the frame portion through the second interposition member, and
 the second interposition member is in contact with an entire side surface of the semiconductor component.

2. The module according to claim 1, wherein the substrate is a coreless substrate.

3. The module according to claim 1, further comprising:
at least a second circuit on the first surface of the semiconductor device; and
at least a third circuit on the substrate,
 wherein the third circuit is connected to the second circuit through a via that penetrates the first surface and the second surface of the semiconductor device.

4. The module according to claim 1, wherein a second gap between the frame portion and the semiconductor device is filled with the third resin.

5. The module according to claim 1, wherein a second gap between the frame portion and the semiconductor component is filled with the plurality of resin layers.

6. The module according to claim 1, wherein the plurality of resin layers comprises a non-translucent resin.

7. The module according to claim 1, wherein the frame portion comprises a device on the substrate.

8. The module according to claim 1, wherein the semiconductor device is connected to the substrate through a bump.

9. The module according to claim 1, wherein each of the plurality of resin layers is different from the second resin.

10. The module according to claim 1, wherein a second gap between the frame portion and the plate-shaped translucent member is filled with the fourth resin.

11. The module according to claim 10, wherein the frame portion, the plate-shaped translucent member, and the fourth resin are flush with one another.

12. A method of manufacturing a module, comprising:
setting a semiconductor component that includes:
 a semiconductor device manufactured by chip-size packaging; and
 a plate-shaped translucent member, wherein
  a first surface of the semiconductor device is along the plate-shaped translucent member, and
  a second surface of the semiconductor device faces a substrate; forming a frame portion on the substrate, wherein
   a shape of the frame portion is an overhang shape,
   an inner surface of the frame portion increasing overhangs to an upper surface of the substrate,
   the frame portion includes a first resin, at least a part of a first circuit is buried in the frame portion, and
the frame portion surrounds the semiconductor component;
forming a first interposition member by filling a gap between the semiconductor component and the substrate with a second resin and solidifying the second resin; and
forming a second interposition member, wherein
the second interposition member comprises a plurality of resin layers,
the plurality of resin layers includes:
a third resin between the frame portion and the semiconductor device;
a fourth resin between the frame portion and the plate-shaped translucent member; and
a fifth resin between the frame portion and a region corresponding to the first surface of the semiconductor device,
each of the third resin, fourth resin, and the fifth resin is different,
the first interposition member is connected and fixed to the frame portion through the second interposition member, and
the second interposition member is in contact with an entire side surface of the semiconductor component.

13. An electronic apparatus, comprising:
a module including:
a substrate;
a semiconductor component that includes:
a semiconductor device; and
a plate-shaped translucent member, wherein
a first surface of the semiconductor device is along the plate-shaped translucent member, and
a second surface of the semiconductor device faces the substrate;
a frame portion on the substrate, wherein
a shape of the frame portion is an overhang shape,
an inner surface of the frame portion increasing overhangs to an upper surface of the substrate,
the frame portion surrounds the semiconductor component,
the frame portion comprises a first resin, and
at least a part of a first circuit is buried in the frame portion;
a first interposition member that fills a gap between the semiconductor component and the substrate, wherein the first interposition member comprises a second resin; and
a second interposition member, wherein
the second interposition member comprises a plurality of resin layers,
the plurality of resin layers includes:
a third resin between the frame portion and the semiconductor device;
a fourth resin between the frame portion and the plate-shaped translucent member; and
a fifth resin between the frame portion and a region corresponding to the first surface of the semiconductor device,
each of the third resin, fourth resin, and the fifth resin is different,
the first interposition member is connected and fixed to the frame portion through the second interposition member, and
the second interposition member is in contact with an entire side surface of the semiconductor component.

* * * * *